(12) United States Patent
Gerst

(10) Patent No.: US 9,609,763 B2
(45) Date of Patent: Mar. 28, 2017

(54) HOUSING WITH LOCKING STRUCTURE

(75) Inventor: Kaljopa Gerst, Altdorf (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1002 days.

(21) Appl. No.: 13/384,655

(22) PCT Filed: Jul. 22, 2010

(86) PCT No.: PCT/IB2010/053342
§ 371 (c)(1),
(2), (4) Date: Jan. 18, 2012

(87) PCT Pub. No.: WO2011/013039
PCT Pub. Date: Feb. 3, 2011

(65) Prior Publication Data
US 2012/0187812 A1    Jul. 26, 2012

(30) Foreign Application Priority Data
Jul. 28, 2009  (EP) ..................................... 09166568

(51) Int. Cl.
| | |
|---|---|
| *H05K 5/00* | (2006.01) |
| *E05C 19/06* | (2006.01) |
| *F16B 5/00* | (2006.01) |
| *F16B 5/06* | (2006.01) |

(52) U.S. Cl.
CPC ........... *H05K 5/0013* (2013.01); *E05C 19/06* (2013.01); *F16B 5/0008* (2013.01); *F16B 5/0664* (2013.01)

(58) Field of Classification Search
USPC ..... 312/223.2, 265.5, 265.6; 292/80, 81, 86, 292/87; 220/685, 683, 682, 691, 4.02, 220/4.22, 4.21, 3.8, 3.7; 403/16, 18, 20; 174/50, 58
See application file for complete search history.

(56) References Cited

U.S. PATENT DOCUMENTS

| | | | |
|---|---|---|---|
| 1,957,066 A * | 5/1934 | Jerner .............................. | 174/57 |
| 4,840,286 A * | 6/1989 | Heberling et al. ........... | 220/4.02 |
| 5,330,366 A | 7/1994 | Tsuji et al. | |

(Continued)

FOREIGN PATENT DOCUMENTS

| | | |
|---|---|---|
| EP | 0090921 A1 | 10/1983 |
| EP | 0409347 A1 | 1/1991 |

(Continued)

*Primary Examiner* — Andrew Roersma

(57) ABSTRACT

The present invention refers to a housing with a locking structure to connect a first housing part (12) with a second housing part (14). The locking structure comprises a flexible snap member (38) extending from the first housing part over an inner wall portion of the second housing part and is provided with a first engaging portion (44). The inner wall portion of the second housing part is provided with a second engaging portion (60). The first and second engaging portions forming a snap fit connection to be released by lifting said snap member from the inner wall portion. A release tool (70) is arranged on or above the bottom of said second housing part to be slidable towards the snap member. The snap member is further provided with a receiving portion being formed to catch the tip (76) of said release tool in a locked manner when the release tool is pushed into the receiving portion.

8 Claims, 9 Drawing Sheets

(56) References Cited

U.S. PATENT DOCUMENTS

| | | | | |
|---|---|---|---|---|
| 5,348,356 | A * | 9/1994 | Moulton | 292/80 |
| 5,507,666 | A * | 4/1996 | Yamanashi | 439/489 |
| 5,681,178 | A * | 10/1997 | Kunkle et al. | 439/352 |
| 5,702,021 | A * | 12/1997 | Ito | 220/326 |
| 5,931,514 | A * | 8/1999 | Chung | 292/89 |
| 5,941,727 | A | 8/1999 | Kodama | |
| 6,006,941 | A * | 12/1999 | Hitchings | 220/284 |
| 6,196,882 | B1 * | 3/2001 | Sato et al. | 439/701 |
| 6,297,948 | B1 * | 10/2001 | Buican et al. | 361/679.58 |
| 6,315,142 | B1 * | 11/2001 | Kitamura et al. | 220/4.02 |
| 6,992,901 | B1 * | 1/2006 | Hung | 361/818 |
| 7,133,279 | B2 * | 11/2006 | Lin | 361/679.33 |
| 7,413,479 | B1 * | 8/2008 | Volpone | 439/692 |
| 7,417,874 | B2 * | 8/2008 | Lee et al. | 361/801 |
| 7,544,888 | B2 * | 6/2009 | Ooi et al. | 174/50 |
| 7,553,180 | B2 * | 6/2009 | Hu et al. | 439/352 |
| 2006/0103140 | A1 | 5/2006 | Bella et al. | |
| 2007/0006249 | A1 * | 1/2007 | Watanabe | 720/723 |
| 2008/0149385 | A1 * | 6/2008 | Kanamaru et al. | 174/520 |

FOREIGN PATENT DOCUMENTS

| | | | | |
|---|---|---|---|---|
| EP | 1156567 A1 * | 11/2001 | | H02G 3/10 |
| FR | 2614169 A1 * | 10/1988 | | H05K 5/00 |
| FR | 2691298 A1 * | 11/1993 | | H02G 3/04 |
| JP | 54135108 U | 9/1979 | | |
| JP | 9092369 A | 4/1997 | | |
| JP | 11145636 A * | 5/1999 | | H05K 5/02 |
| JP | 2007005701 A | 1/2007 | | |
| JP | 20078005701 A * | 1/2007 | | H05K 5/02 |

\* cited by examiner

HOUSING WITH LOCKING STRUCTURE

FIELD OF THE INVENTION

The present invention relates to a housing with a locking structure to interlock different parts of the housing with each other.

BACKGROUND OF THE INVENTION

Housings of technical devices exist in a large variety of different embodiments. For example, housings of electrical devices like measurement systems or medical devices serve to protect the damageable electrical parts of the device stored inside the housing. To provide a reliable connection between its different housing parts, the housing is provided with a locking structure which may be released so that the inner parts of the housing are accessible. The locking structure should prevent the different housing parts from falling apart. However, releasing the locking structure should be possible at least for experienced personnel without unnecessary complications. For example, the locking structure can comprise screws or the like which can easily be removed with a corresponding tool like a screwdriver.

In cases where a tool is necessary to release the locking structure, there is always the problem that the locking member which has to be released by the tool must be accessible from the outside of the housing. That is, the locking member in question is visible on the surface of the housing, or at least an opening or any other access must be provided for introducing the tool into the housing. In all known cases the design and outer appearance of the housing is affected by the provision of the locking structure. For example, it is in some cases desired to connect complementary parts of a housing by a snap-fit connection. Although it is easy to arrange such a connection by snap members on the inside of the housing, it is impossible in this case to release this snap-fit connection by a tool from outside without damaging the housing.

In the related technical field of electrical connectors a number of solutions for unlocking a snap-fit connection between the male and female part of the connector by means of an unlocking tool exists. For example, document JP-9092369 A discloses a connector wherein the tool is used to release a locking lever of the connector so that the male and female connector parts can be disengaged. However, this construction has the same disadvantage as described above, namely that an opening for introducing the tool is indispensable, and apart from that this solution cannot easily be applied to a housing with two complementary housing parts which have to be connected at the edges of their adjacent wall portions.

It is therefore an object of the present invention to provide a housing with a locking structure which can be assembled and disassembled easily without providing an access for an additional tool at the side of the housing where the locking structure is present, so that the surface of the housing is not affected by the provision of the locking structure or any means to make the locking structure accessible.

SUMMARY OF THE INVENTION

This object is achieved by a housing with a locking structure, said housing comprising at least a first housing part and an adjacent second housing part, said locking structure comprising a flexible snap member extending from the first housing part over an inner wall portion of the second housing part and being provided with a first engaging portion. The inner wall portion of the second housing part is provided with a second engaging portion, said first engaging portion and said second engaging portion forming a snap-fit connection to be released by lifting said snap member from the inner wall portion. A release tool is provided on or above the bottom of the second housing part to be slidable towards the snap member. The snap member is further provided with a receiving portion for catching the tip of the release tool in a locked manner when the release tool is pushed into the receiving portion in a direction perpendicular to the extension direction of the snap member.

The locking structure of this housing can be arranged inside the housing at the abutting edges of two wall portions of the adjacent housing parts. The flexible snap member is arranged to slide over the inner wall portion of the second housing part to engage with the second engaging portion, so that the two engaging portions of the snap member and the inner wall portion form the snap-fit connection. In this situation both housing parts are interlocked with each other, and the housing cannot be disassembled unintentionally. It is noted that no part of the locking structure is visible from the outside of the housing.

To release the snap-fit connection between the first and the second engaging portion, the flexible snap member can be lifted from the inner wall portion of the second housing part against its restoring force. In the lifted state, the snap-fit connection is released, and both housing parts can easily be disassembled by pulling them apart in the direction opposite to the extension direction of the snap member, i.e. by a movement opposite to the sliding direction to assemble the housing parts.

The lifting of the snap member can be achieved by the integrated release tool that can be pushed into a receiving portion of the snap member. The receiving portion is formed to catch the tip of the release tool so that the tip of the tool and the snap member are interlocked with each other. The receiving portion and the tip of the release tool can be formed complementary so that introducing the tip of the release tool is easy, but the release tool cannot be easily pulled back in the opposite direction when the tip has been introduced into the receiving portion. When the release tool is pulled back in the interlocked position of the receiving portion and the tool, a pulling force acts on the snap member, lifting it in the above-described way to release the snap-fit connection between the two housing parts.

Because the release tool is integrated into the housing, no other external tool has to be introduced into the housing to release the locking structure. Consequently the provision of an access for a tool from outside is dispensable. For example, the release tool can be provided as a slider sliding at the bottom of the second housing part against its inner wall portion. An actuating or guiding means for sliding the release tool can be provided. The free end of the tool can also be accessible from an opposite side of the housing which is open or provided to be opened anyway to access the space inside the housing and which can be opened or closed by a lid or the like. At least at the side of the housing where the locking structure is located, the external design of the housing is not affected by the locking structure. Assembling and disassembling the housing can easily accomplished by pushing the two housing parts together to form the snap-fit connection, and using the release tool to unlock the snap-fit connection by lifting the snap member from the inner wall portion.

Within the scope of the present invention, various embodiments can be realized.

According to one embodiment, the receiving portion of the snap member is formed as a female receiving portion at the free end of the snap member to receive the tip of the release tool as a male penetrating portion.

According to another embodiment of the invention, the receiving portion comprises two flexible branches at the free end of the snap member which are spaced apart in the lateral direction of the snap member.

These branches can point downwards towards the bottom of the second housing part. By pushing the release tool into the receiving portion, the branches are deformed and evade in the lateral direction so that the tip of the release tool can be introduced into the receiving portion until the locking state is reached.

According to a preferred embodiment, these branches comprise dented cross sections with slant faces facing each other and narrowing the space between the branches towards the inner wall surface.

During the pushing of the release tool into the receiving portion, the tip of the release tool can slide along the guiding slant faces to push the two branches outwards until the tip is locked between the branches. This locking can be achieved by a corresponding form of the tip of the tool, which can comprise a cross section in form of a hook, a harpoon, a dentation or the like.

In a preferred embodiment the snap member is shaped in the form of the letter H.

The traverse of the letter H can be provided with a dentation or a hook which forms the first engaging portion to fit the second engaging portion on the inner wall portion of the second housing part. From this traverse, the two branches mentioned above point downwards.

Preferably, the first engaging portion comprises a dentation or a hook.

According to one preferred embodiment, the second engaging portion comprises an undercut at the inner wall portion.

Preferably, the tip of the release tool has the form of a hook bending in a direction towards the first housing part.

Further aspects and benefits of the present invention will become apparent from the detailed description provided hereinafter. It should be understood that the detailed description and specific examples, while indicating exemplary embodiments of the invention, are intended for purposes of illustration only and are not intended to limit the scope of the invention.

BRIEF DESCRIPTION OF THE DRAWINGS

The above-mentioned features, aspects and advantages of the present invention will become better understood from the following description with reference to the accompanying drawings where.

DETAILED DESCRIPTION OF EMBODIMENTS

Figure 1:
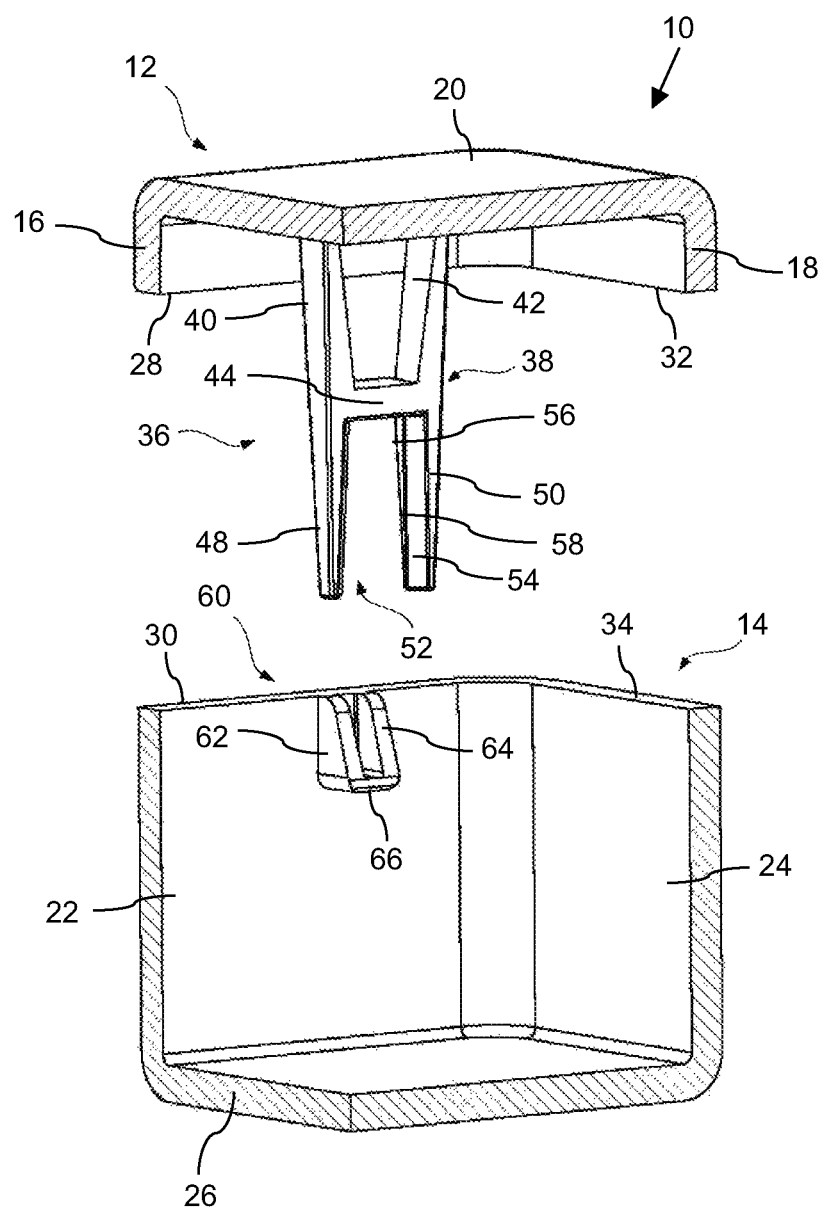
FIG. 1 is a sectional view of a housing with a locking structure corresponding to a preferred embodiment of the present invention, said housing being depicted in a disjointed state.

The housing 10 shown in FIG. 1 comprises an upper housing part 12 and a lower housing part 14 to be joined together by means of a locking structure, as will be explained in the following. While the lower housing part 14 may contain electrical equipment or the like, which shall be protected against the environment, the upper housing part 12 may have the function of a lid which is detachable from the lower housing part 14 by unlocking the locking structure. FIG. 1 shows the upper housing part 12 and the lower housing part 14 in the disengaged state in which the housing 10 is opened. In the following FIGS. 2 and 3, the housing 10 is shown in the closed state wherein the locking structure is engaged so that opening the housing 10 accidentally is impossible or at least unlikely.

Figure 2:
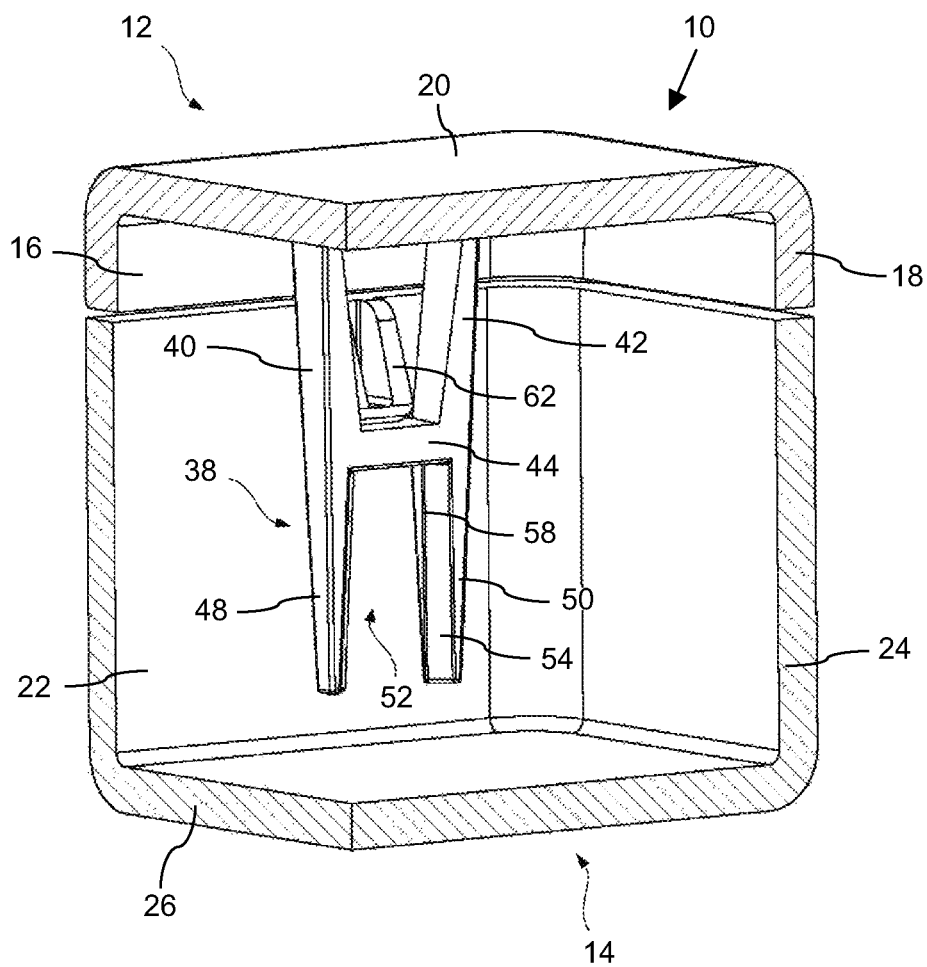
FIG. 2 shows the housing of FIG. 1 in a jointed state, the perspective being similar to FIG. 1.
Figure 3:
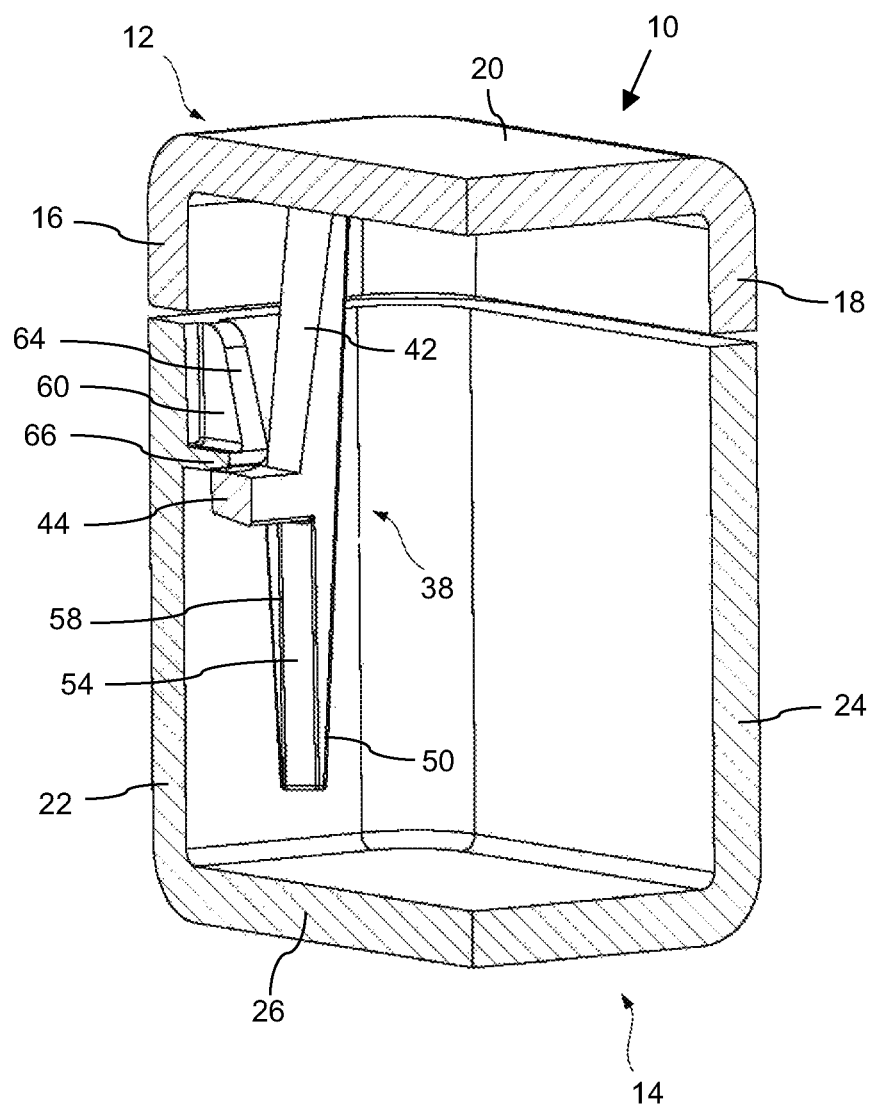
FIG. 3 shows a sectional view of said housing of FIGS. 1 and 2.

The upper housing part 12 comprises a vertical first sidewall 16, an adjacent vertical second sidewall 18 and a ceiling portion 20. In a similar way, the lower housing part 14 comprises a vertical first sidewall 22, a vertical second sidewall 24 and a bottom 26. To close the housing, a first lower edge 28 of the first side wall 16 of the upper housing part 12 has to be abutted to a first upper edge 30 of the first sidewall 22 of the lower housing part 14. In this state a second lower edge 32 of the second sidewall 18 of the upper housing part 12 is also placed on a second upper edge 34 of the second sidewall 24 of the lower housing part 14. This state is shown in FIGS. 2 and 3.

The locking structure 36 of the housing 10 comprises a flexible snap member 38 being formed integrally with the upper housing part 12. The snap member 38 extends from the ceiling 20 of the upper housing part 12 over the inner portion of the first sidewall 16 and protrudes over its lower edge 28 towards the lower housing member 14. The snap member 38 is flexible in a way that it can be deflected at least in a lateral direction, i.e. in a direction perpendicular to its extending direction. Generally speaking, the snap member 38 has the form of the letter "H", with two upper branches 40, 42 extending downwards from the ceiling 20 and being joined at their lower ends by a traverse 44. As will be explained in the following part of the description, the traverse 44 forms a first engaging portion to engage a second engaging portion which is formed at the lower housing part 14. To improve the engaging effect, the traverse 44 can optionally be provided with a dented portion on the side of the snap member 38 facing the first sidewall 16 of the upper housing part 12.

The snap member 38 further comprises two flexible branches 48, 50 extending in parallel downwards from the traverse 44 to complete the form of the letter "H". Since the ends of these lower branches 48, 50 are free, these branches 48, 50 can be deflected outwards so that the space 52 between the lower branches 48, 50 can be widened by pressing the branches 48, 50 outwards against their restoring force. Each of these lower branches 48, 50 at the free end of the snap member 38 comprises a substantially triangular cross section, with two slant faces 54, 56 at the inside of the snap member 38 facing the respective other branch 48, 50. The two slant faces 54, 56 are divided by an edge portion 58 extending from the traverse 44 downwards to the free end of the respective branch 48, 50. Both edge portions 58 of the two branches 48, 50 form the narrowest portion of the space 52 between the branches 48, 50. The slant faces 54 on one lateral side of the snap member 38 narrow the space 52 between the branches 48, 50 in the direction towards the inner wall surfaces of the sidewalls 16, 22 so that a dentation at each branch 48, 50 is formed.

On the first sidewall 22 of the lower housing part 14, a second engaging portion 60 is formed by a dented protrusion 62 protruding from the inner wall surface of the first sidewall 22 of the lower housing part 14. This dented protrusion 62 comprises one slant surface 64 extending from the upper edge 30 of the sidewall 22 to a lower edge 66 of the protrusion 62 which is spaced from the inner wall surface of the sidewall 22, forming an undercut at the inner surface of the sidewall 22. From the upper edge 30, the slant surface 64 extends downwards in an oblique direction away from the inner wall surface.

To fit the housing parts 12, 14 together, the upper housing part 12 is moved in the direction of the lower housing part 14. In a first phase of movement, the dented protrusion 62 of the second engaging portion 60 slides into the space 52 between the lower branches 48, 50 of the snap member 38 until the traverse 44 reaches the upper edge of the dented protrusion 62. During the further movement, the snap member 38 is deflected by the protrusion 62 in an inward direction away from the inner wall surface of the side wall 22, so that the traverse 22 can slide on the slant surface 64 of the protrusion 62. When the traverse 44 passes the lower edge 66 of the dented protrusion 62, the snap member 38 snaps back because of its restoring force against the inner wall surface of the side wall 22, so that the snap member 39 and the dented protrusion 62 are engaged with each other and form a snap-fit connection between the first engaging portion 36 and the second engaging portion 60. This snap-fit connection cannot simply be released by pulling the two housing parts 12, 14 apart in the opposite direction, i.e. by simply lifting the upper housing part 12 from the lower housing part 14. This state is shown in FIG. 2.

FIG. 3 shows another cross section of the assembled housing parts 12 and 14 in a position corresponding to FIG. 2. In FIG. 3 it is depicted how the traverse 44 lies in the undercut formed under the dented protrusion 62, forming an engaged locking state which prevents the two housing parts 12, 14 from being separated. In this position the traverse 44 cannot easily slide over the lower surface 68 when a force acts on the upper housing part 12 which is directed upwards opposite to the extension direction of the snap member 38.

Figure 4:
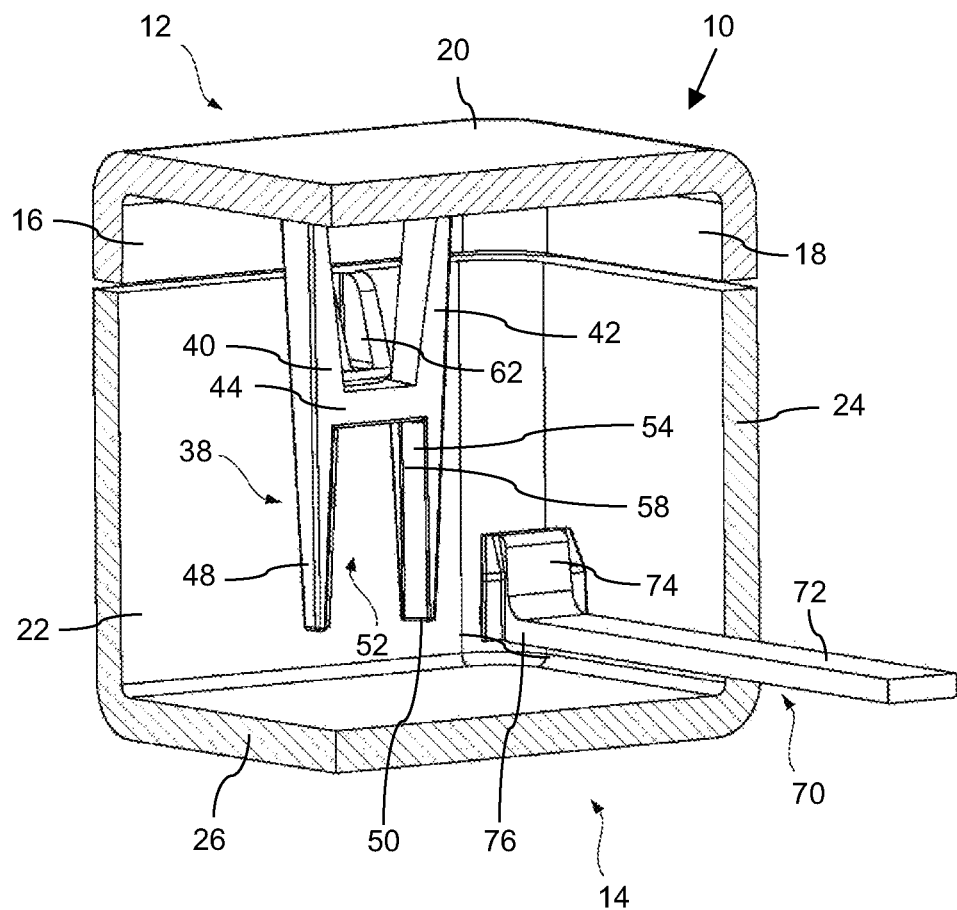
FIGS. 4 to 9 show different phases of opening said embodiment of the housing by means of a release tool.
Figure 5:
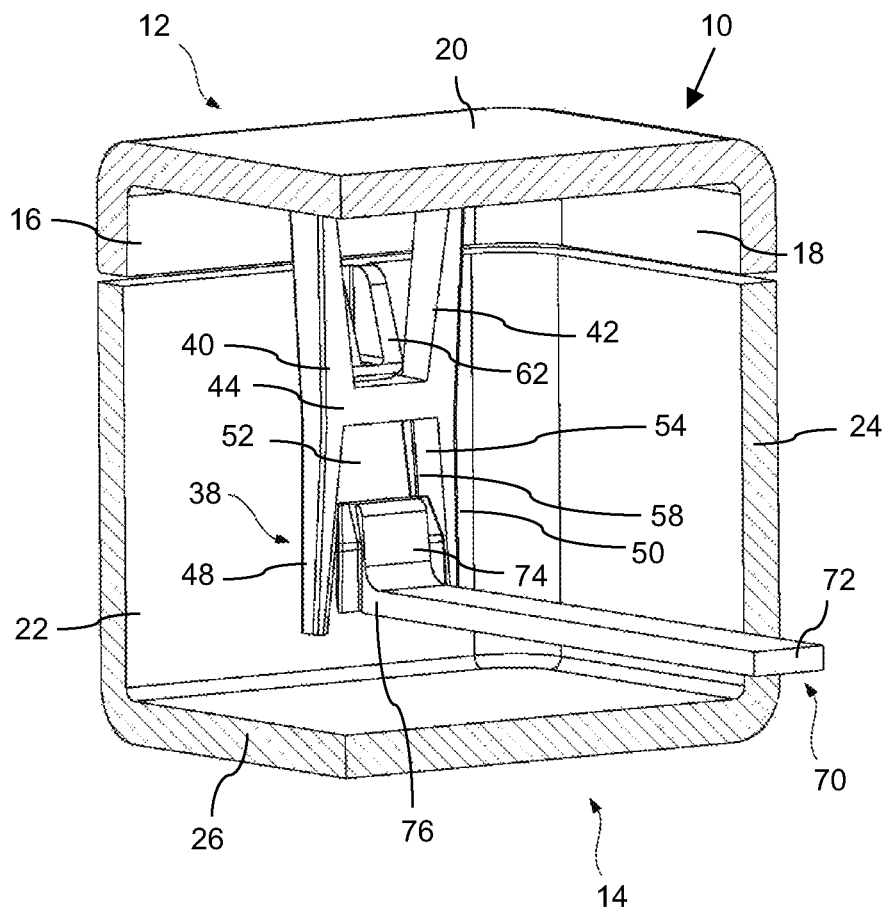
Figure 6:
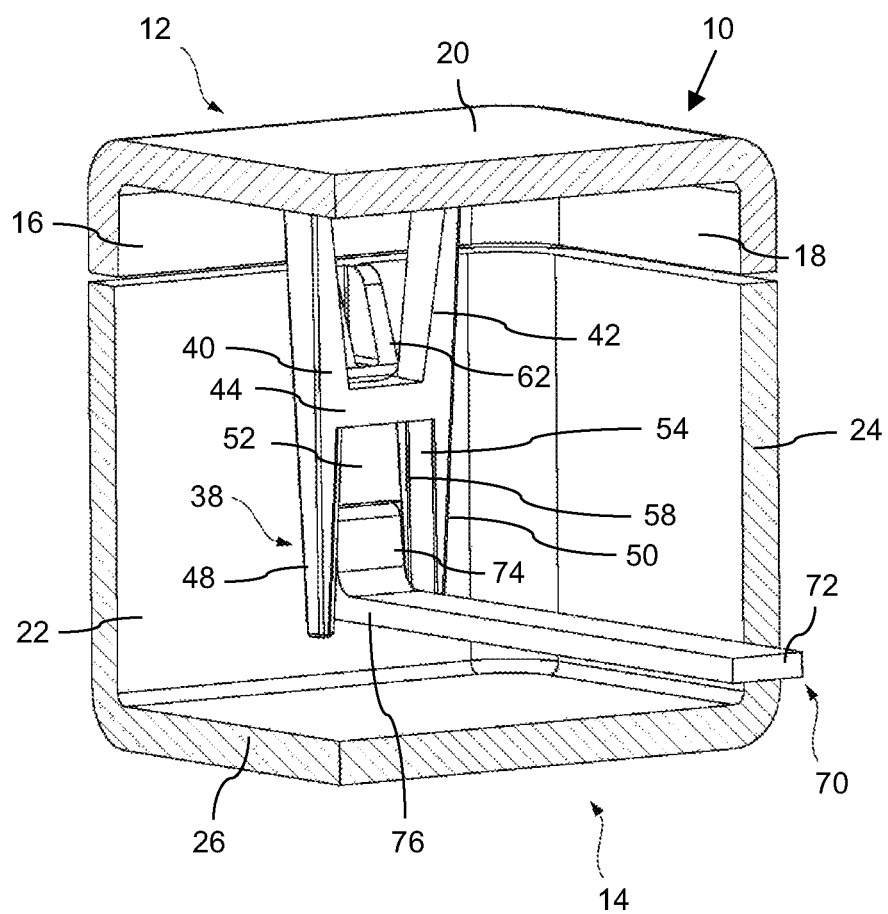

FIGS. 4 to 6 show an opening sequence for disengaging the first engaging portion 44 from the second engaging portion 60 so that the upper housing part 12 and the lower housing part 14 can be disconnected easily. For releasing the snap-fit connection, a release tool 70 is provided inside the housing 10 which can be moved in a direction towards the snap member 38. Stated more precisely, the moving direction of the release tool 70 is perpendicular to the inner wall surface of the sidewall 22 of the lower housing part 14.

The release tool 70 comprises a rod 72 extending parallel to the bottom 26 of the lower housing part 14 in the moving direction of the release tool 70. At the front end, the release tool 70 is provided with a tip 76 formed as a hook portion 74 which extends upwards, facing the upper housing part 12. The hook portion 74 has a cross section in a trapezoidal form, comprising a flat front portion (not shown in the Figures) and slanted vertical side portions at both sides of the flat front portion.

The release tool 70 is arranged above the bottom 26 of the lower housing part 14 to be slideable towards the snap member 38. Means for guiding the release tool 70 can be provided but are not shown in the described embodiment. The release tool 70 is positioned so that it can be pressed into the space 52 dividing the lower branches 48, 50 of the snap member 38. The contact position of the tip 76 of the release tool 70 and the lower end of the snap member 38 is shown in FIG. 5. In this position the slant side faces of the hook portion 74 abut the respective slant faces 54 at the two lower branches 48, 50 of the snap portion 38. By pressing the release tool further towards the inner wall surface of the sidewall 22, the slant faces at the hook portion 74 at the tip 76 of the release tool 70 slide on the slant faces 54 of the branches 48, 50, pressing the flexible branches 48, 50 outwards so that the space 52 between the branches 48, 50 is widened at the lower end of the snap member 38. When the hook portion 54 has passed the edges 58 which mark the narrowest passage between the branches 48, 50, the branches 48, 50 slide back behind the hook portion 54 so that the tip 76 of the release tool 70 is catched in a locked manner. This means that the release tool 70 cannot be pulled in the opposite direction away from the sidewall 22 without deflecting the snap member 38. The locking of the tip 76 of the release tool 70 is achieved by the engagement of the hook portion 74 behind the branches 48 and 50 of the snap member 38. With regard to the tip 76 of the release tool 70, the two flexible branches 48 and 50 being spaced apart form a receiving portion at the lower end of the snap member 38.

Figure 7:
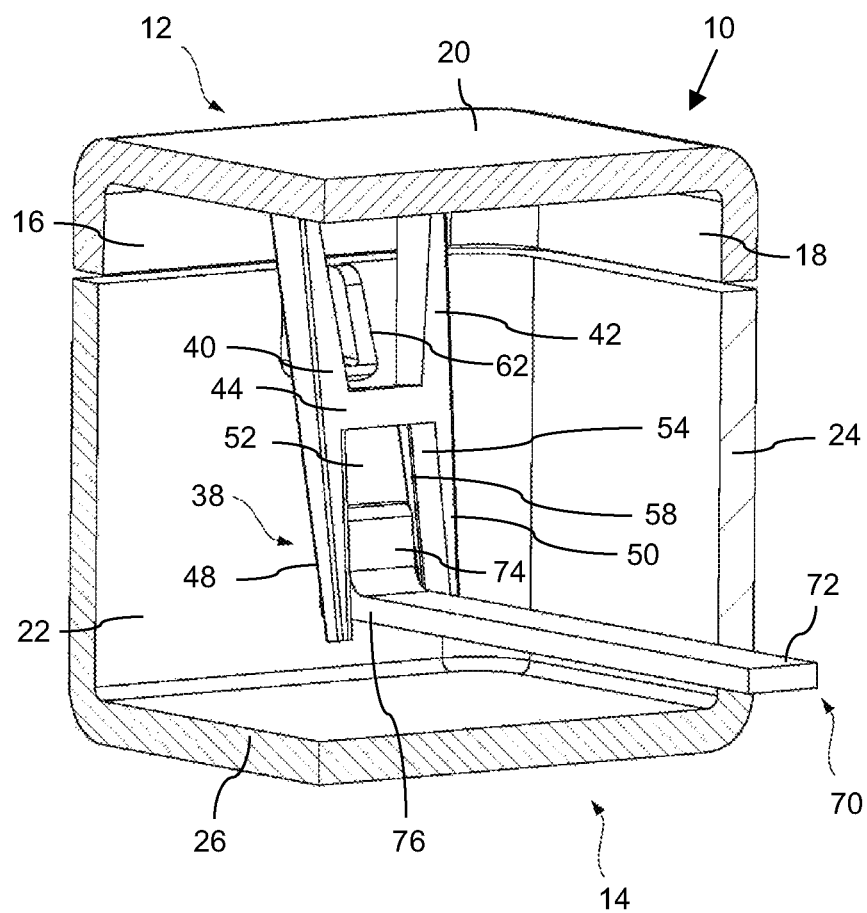
Figure 8:
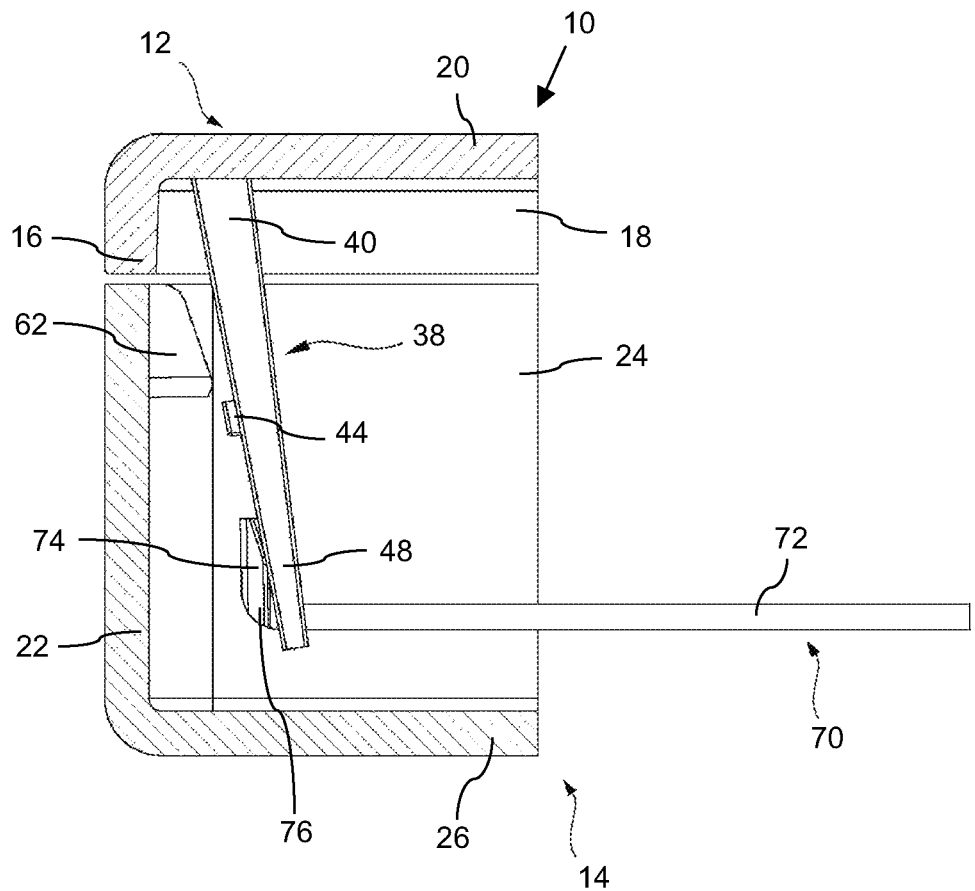
Figure 9:
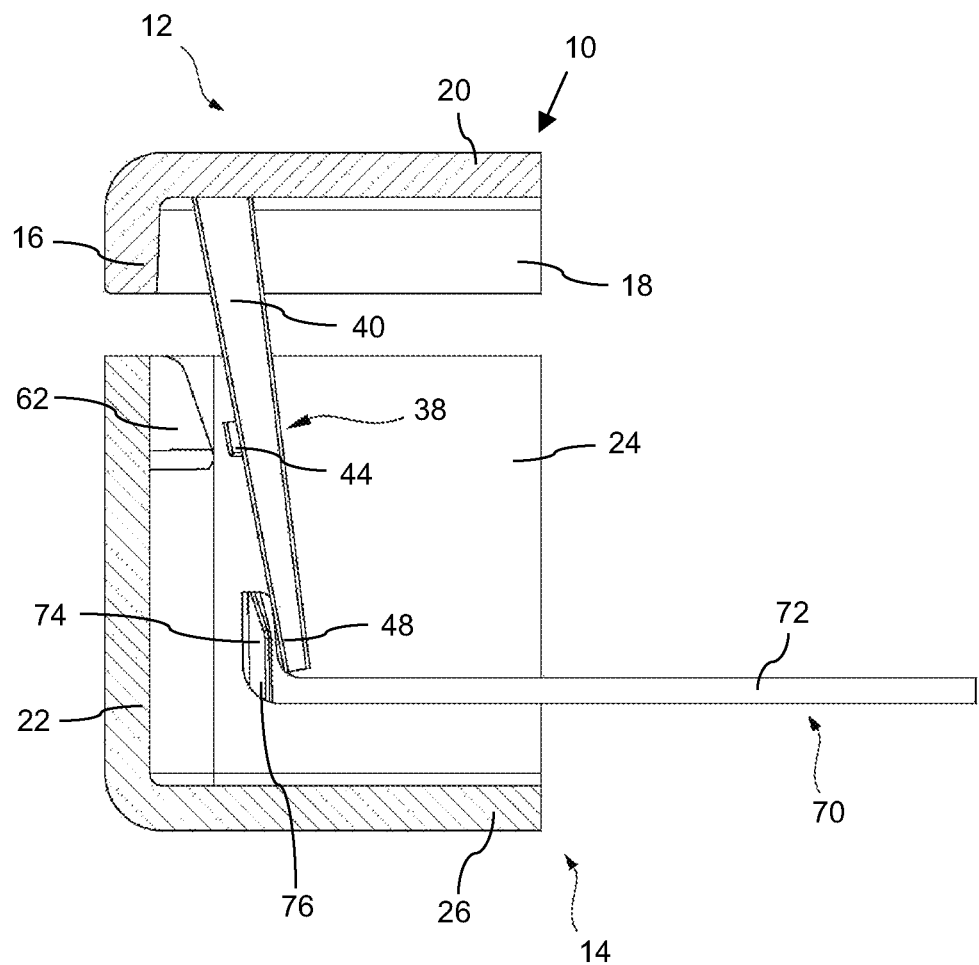

From the position shown in FIG. 6, the snap-fit connection of the first engaging portion 36 and the second engaging portion 60 can be released by lifting the snap member 38 from the inner wall portion of the sidewall 22. This is achieved by pulling the release tool 70 in a direction away from the sidewall 22 so that the snap member 38 is deflected and lifted from the inner wall surface of the sidewall 22. Once the snap member 38 is lifted, the engagement of the traverse 44 with the dented protrusion 62 is released so that the traverse 44 can slide upwards along the slant surface 64, making it possible to detach the upper housing part 12 from the lower housing part 14. This is shown in FIGS. 7 and 8 in different perspectives. In the perspective view of FIG. 7 and in the side view of FIG. 8, one can see the deflection of the snap member 38 to an oblique position deflected away form the sidewall 22, where the traverse 44 as the first engaging portion is disengaged from the dented protrusion 62 as the second engaging portion. In the situation shown in FIGS. 7 and 8, the upper housing part 12 can be lifted easily from the lower housing part to reach the lifted position shown in FIG. 9.

In short, releasing the snap-fit connection between the snap member 38 and the dented protrusion 62 is achieved by pushing the tip 76 of the release tool 70 into the receiving portion of the snap member 38, so that the tip 76 can be caught between the two flexible branches 48, 50 in a locked manner, and by pulling the release tool 70 back in the opposite direction to deflect the snap member 38 itself so that it can be lifted from the inner wall portion and the snap-fit connection is disengaged to unlock the housing 10.

It is to be noted that the first engaging portion 36 of the upper housing part 12 and the second engaging portion 60 of the lower housing part 14 may take other forms different to the embodiment described here, for example, by any male/female engaging portions being provided at the respective housing parts. Moreover, the receiving portion at the free end of the snap member 38 to receive the tip 76 of the release tool 70 may be formed in a different way. Preferably, this receiving portion at the bottom end of the snap member 38 is formed as a female receiving portion into which a male penetrating portion at the tip 76 of the release tool 70 is pushed to form the locking connection.

The above description is intended to be merely illustrative of the present invention and should not be construed as limiting the appended claims to any particular embodiment or a group of embodiments. While the invention has been described in detail with reference to specific exemplary embodiments thereof, different modifications and changes can be made thereto without departing from the spirit and scope of the invention as set forth in the claims. The specification and drawings are accordingly to be regarded in an illustrative manner and are not intended to limit the scope of the claims. In the claims, the word "comprising" does not exclude other elements or steps, and the indefinite article "a" or "an" does not exclude a plurality. Any reference signs in the claims should not be construed as limiting the scope.

The invention claimed is:

1. A housing with a locking structure,
said housing comprising at least a first housing part and an adjacent second housing part,
said locking structure comprising a flexible snap member extending from the first housing part over an inner wall portion of the second housing part and being provided with a first engaging portion,
said inner wall portion of the second housing part being provided with a second engaging portion,
said first engaging portion and second engaging portion forming a snap fit connection to be released by lifting said snap member from the inner wall portion,
and a release tool arranged on or above the bottom of said second housing part to be slidable towards the snap member,
said snap member being further provided with a receiving portion being formed to catch and interlock with the tip of said release tool such that the tip of the tool and the snap member are interlocked with each other when the release tool is pushed into the receiving portion.

2. The housing according to claim 1, wherein said receiving portion is formed as a female receiving portion at the free end of the snap member to receive said tip of the release tool as a male penetrating portion.

3. The housing according to claim 2, wherein said receiving portion comprises two flexible branches at the free end of the snap member which are spaced apart in the lateral direction of the snap member.

4. The housing according to claim 3, wherein said branches comprise dented cross sections with slant faces facing each other and narrowing the space between the branches towards the inner wall portion.

5. A housing with a locking structure, comprising:
a first housing part;
an adjacent second housing part;
a flexible snap member extending from the first housing part over an inner wall portion of the second housing part, the flexible snap member being in the form of a letter H, a cross bar of the H defining a first engaging portion and branches of the H diverging from the cross bar to define a tapered receiving portion;
the inner wall portion of the second housing part defining a projecting second engaging portion;
the first engaging portion and second engaging portion forming a snap fit connection to be released by lifting said snap member from the inner wall portion;
and a release tool arranged on or above a bottom of said second housing part, the release tool having a tapered tip configured to slide in a first direction between the branches and to move transverse to a sliding direction to interlock with the branches such that sliding the release tool in a second direction opposite to the first direction pulls the cross bar away from the inner wall portion of the first part disengaging the first and second engaging portions.

6. The housing according to claim 1, wherein said first engaging portion comprises a dentation or a hook.

7. The housing according to claim 1, wherein said second engaging portion comprises an undercut at the inner wall portion.

8. A housing with a locking structure,
said housing comprising at least a first housing part and an adjacent second housing part,
said locking structure comprising a flexible snap member extending from the first housing part over an inner wall portion of the second housing part and being provided with a first engaging portion,
said inner wall portion of the second housing part being provided with a second engaging portion,
said first engaging portion and second engaging portion forming a snap fit connection to be released by lifting said snap member from the inner wall portion,
and a release tool arranged on or above the bottom of said second housing part to be slidable towards the snap member,
said snap member being further provided with a receiving portion being formed to catch and interlock with the tip of said release tool such that the tip of the tool and the snap member are interlocked with each other when the release tool is pushed into the receiving portion,
wherein the tip of the release tool has the form of a hook bending in a direction towards the first housing part.

* * * * *